United States Patent
Arnold et al.

(10) Patent No.: US 10,580,652 B2
(45) Date of Patent: *Mar. 3, 2020

(54) ALTERNATING HARDMASKS FOR TIGHT-PITCH LINE FORMATION

(71) Applicant: INTERNATIONAL BUSINESS MACHINES CORPORATION, Armonk, NY (US)

(72) Inventors: John C. Arnold, North Chatham, NY (US); Anuja E. DeSilva, Slingerlands, NY (US); Nelson M. Felix, Braircliff Manor, NY (US); Chi-Chun Liu, Altamont, NY (US); Yann A. M. Mignot, Slingerlands, NY (US); Stuart A. Sieg, Albany, NY (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/058,088

(22) Filed: Aug. 8, 2018

(65) Prior Publication Data

US 2018/0350600 A1    Dec. 6, 2018

Related U.S. Application Data

(63) Continuation of application No. 15/463,659, filed on Mar. 20, 2017, now Pat. No. 10,103,022.

(51) Int. Cl.
| | |
|---|---|
| *H01L 21/033* | (2006.01) |
| *H01L 21/308* | (2006.01) |
| *H01L 21/311* | (2006.01) |
| *H01L 21/3213* | (2006.01) |

(Continued)

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/3081* (2013.01); *H01L 21/3086* (2013.01); *H01L 21/3088* (2013.01); *H01L 21/31122* (2013.01); *H01L 21/31144* (2013.01); *H01L 21/32137* (2013.01); *H01L 21/823431* (2013.01); *H01L 29/6656* (2013.01); *H01L 29/66795* (2013.01); *Y10S 438/947* (2013.01); *Y10S 438/95* (2013.01)

(58) Field of Classification Search
None
See application file for complete search history.

(56) References Cited

U.S. PATENT DOCUMENTS

| | | |
|---|---|---|
| 5,821,169 A | 10/1998 | Nguyen et al. |
| 8,114,306 B2 | 2/2012 | Cheng et al. |
| 8,278,221 B2 | 10/2012 | Koh et al. |

(Continued)

OTHER PUBLICATIONS

Douglas J. Guerrero et al., Multifunctional hardmask neutral layer for directed self-assembly (DSA) patterning, Proc. SPIE 8680, (Mar. 26, 2013).

(Continued)

*Primary Examiner* — Jiong-Ping Lu

(57) ABSTRACT

Methods of forming fins include masking a region on a three-color hardmask fin pattern, leaving a fin of a first color exposed. The exposed fin of the first color is etched away with a selective etch that does not remove fins of a second color or a third color. The mask and all fins of a second color are etched away. Fins are etched into a fin base layer using the fins of the first color and the fins of the third color.

20 Claims, 12 Drawing Sheets

(51) Int. Cl.
*H01L 29/66* (2006.01)
*H01L 21/8234* (2006.01)

(56) References Cited

U.S. PATENT DOCUMENTS

| | | | |
|---|---|---|---|
| 8,859,433 B2 | 10/2014 | Abdallah et al. | |
| 8,900,665 B2 | 12/2014 | Koshy | |
| 9,099,401 B2 | 8/2015 | He et al. | |
| 9,269,268 B2 | 2/2016 | Jacob | |
| 9,287,135 B1 | 3/2016 | Doris et al. | |
| 9,337,033 B1 | 5/2016 | Glodde et al. | |
| 9,349,604 B2 | 5/2016 | Rathsack et al. | |
| 9,368,349 B2 | 6/2016 | Huang et al. | |
| 9,391,141 B2 | 7/2016 | Chan et al. | |
| 9,425,058 B2 | 8/2016 | Kim et al. | |
| 9,431,265 B2 | 8/2016 | Cheng et al. | |
| 9,450,079 B2 | 9/2016 | Cheng et al. | |
| 9,515,089 B1 | 12/2016 | Cheng et al. | |
| 9,536,750 B1 | 1/2017 | Chi et al. | |
| 9,680,018 B2 | 6/2017 | Hashemi et al. | |
| 9,837,410 B1 | 12/2017 | Cheng | |
| 9,922,972 B1 | 3/2018 | Qiu et al. | |
| 9,935,181 B2 | 4/2018 | Cheng et al. | |
| 9,941,164 B1 | 4/2018 | Kim | |
| 10,103,022 B2 * | 10/2018 | Arnold | H01L 21/0337 |
| 2010/0267328 A1 | 10/2010 | Johnson et al. | |
| 2014/0284667 A1 | 9/2014 | Basker et al. | |
| 2014/0322915 A1 | 10/2014 | Lee et al. | |
| 2015/0255542 A1 | 9/2015 | Cai et al. | |
| 2016/0042964 A1 | 2/2016 | Lo et al. | |
| 2016/0071930 A1 | 3/2016 | Bentley et al. | |
| 2016/0211168 A1 | 7/2016 | Paak et al. | |
| 2016/0240474 A1 | 8/2016 | Yu-Tseng et al. | |
| 2016/0254369 A1 | 9/2016 | Yi et al. | |
| 2017/0219925 A1 | 8/2017 | Wang et al. | |
| 2018/0122637 A1 | 5/2018 | Sherpa et al. | |

OTHER PUBLICATIONS

Ting Han et al., A Paradigm Shift in Patterning Foundation from Frequency Multiplication to Edge-Placement Accuracy—A Novel Processing Solution by Selective Etching and Alternating-Material Self-Aligned Multiple Patterning; Proc. SPIE 9777, Alternative Lithographic Technologies VIII, 977718 (Mar. 22, 2016).

List of IBM Patents or Patent Applications Treated as Related dated Aug. 8, 2018, 2 pages.

Ting Han, A Paradigm Shift in Patterning Foundation from Frequency Multiplication to Edge-Placement Accuracy—A Novel Processing Solution by Selective Etching and Alternating-Material Self-Aligned Multiple Patterning, Alternative Lithographic Technologies VIII, edited by Christopher Bencher, Joy Y. Cheng, Proc. of SPIE vol. 9777, 977718, Mar. 2016.

Shengxiang Ji, Directed self-assembly of block copolymers on chemicalpatterns: A platform for nanofabrication, Progress in Polymer Science 54-55, Oct. 2015.

Hongyi Liu, Layout Decomposition and Synthesis for a Modular Technology to Solve the Edge-Placement Challenges by Combining Selective Etching, Direct Stitching, and Alternating-Material Self-Aligned Multiple Patterning Processes, Design-Process-Technology Co-optimization for Manufacturability X, edited by Luigi Capodieci and Jason P. Cain, Proc. of SPIE vol. 9781, Mar. 2016.

Non Final Rejection from U.S. Appl. No. 15/445,112 dated May 3, 2018 (16 pages).

Final Rejection from U.S. Appl. No. 15/445,112 dated Oct. 5, 2018 (10 pages).

List of IBM Patents or Patent Applications Treated as Related dated Mar. 13, 2019, 2 pages.

* cited by examiner

ALTERNATING HARDMASKS FOR TIGHT-PITCH LINE FORMATION

BACKGROUND

Technical Field

The present invention generally relates to semiconductor fabrication and, more particularly, to the formation of hardmasks in semiconductor fabrication processes.

Description of the Related Art

Fin field effect transistors (FinFETs) and other fin-based devices are frequently used in semiconductor structures to provide small-scale integrated circuit components. As these devices scale down in size, performance can be increased but fabrication becomes more difficult. In particular, errors in edge placement, critical dimension, and overlay approach the size of the structures being fabricated, making it difficult to accurately form such structures.

One particular challenge in forming fin structures is the selective removal of particular fins. For example, while a series of fins can be created using, e.g., sidewall image transfer techniques, significant errors in masking the fins may occur when operating near the limit of the lithographic process. Such errors may cause fins neighboring the removed fin to be damaged or removed entirely.

SUMMARY

A method of forming fins includes masking a region on a three-color hardmask fin pattern, leaving a fin of a first color exposed. The exposed fin of the first color is etched away with a selective etch that does not remove fins of a second color or a third color. The mask and all fins of a second color are etched away. Fins are etched into a fin base layer using the fins of the first color and the fins of the third color.

A method of forming a three-color hardmask fin pattern includes forming seed layer fins. Self-assembled fins are formed by directed self-assembly on the seed layer fins. A layer of a first color is etched using the self-assembled fins as a mask to form fins of a first color. A second-color material is deposited around the fins of the first color. Fins of the first color are etched away, leaving at least one fin of the first color. Fins of a third color are formed in gaps left by etching away fins of the first color.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a hardmask fabrication process that may be used for fin formation in semiconductor fabrication. The present embodiment forms hardmask fins of three different compositions that have mutual etch selectivity, such that a spacing between fins of the same type is large enough that lithographic masking errors will not interfere when selectively removing fins. This provides a tri-color alternating hardmask, where the three different "colors" represent the three different fin hardmask composition. Thus the term "color" is defined herein to refer to one particular hardmask composition.

The present disclosure therefore refers to "first-color," "second-color," and "third-color" materials and fins. Each of these "colors" can be etched selectively to the other two, making it possible to remove a fin of one color without damaging nearby fins of a different color.

Figure 1:
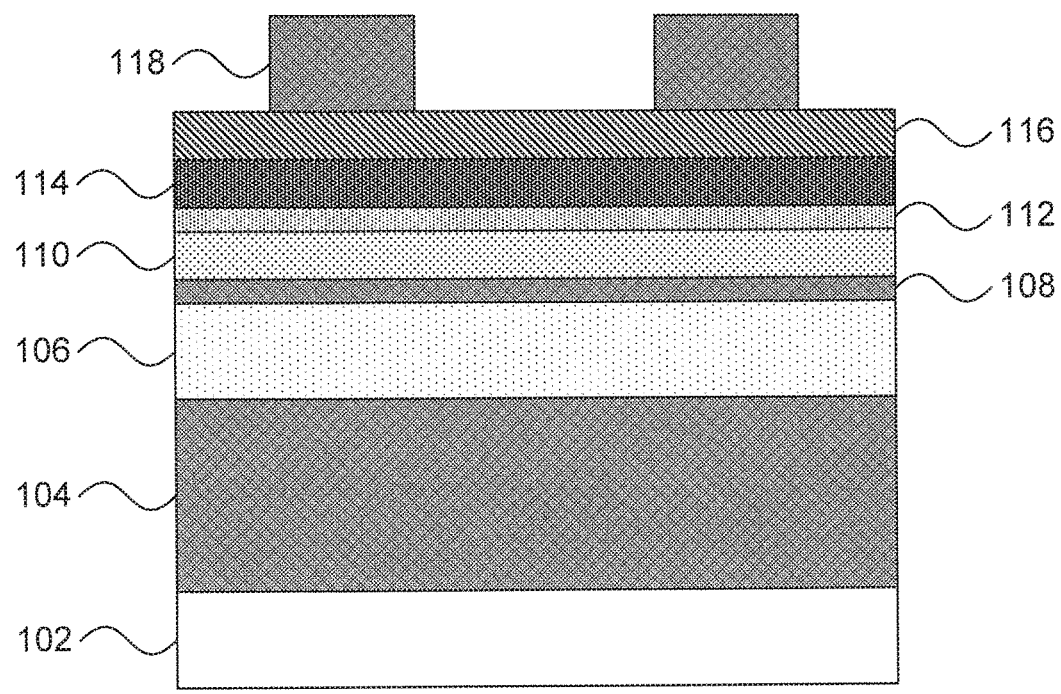
FIG. 1 is a cross-sectional diagram of a step in the formation of a tri-color hardmask in accordance with one embodiment of the present invention.

Referring now to FIG. 1, a cross-sectional diagram of a step in forming tri-color alternating hardmask is shown. A layer of fin base material 104 is formed on a semiconductor substrate 102. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

The fin base material 104 may be any appropriate material that may be used as a hardmask for the eventual formation of semiconductor fins in the semiconductor substrate 102. In one embodiment, it is contemplated that the layer of fin base material 104 may have a thickness of about 40 nm. It is specifically contemplated that silicon nitride may be used for the fin base material 104, but it should be understood that any appropriate hardmask material having etch selectivity with the underlying semiconductor and the three tri-color hardmask materials may be used. As used herein, the term "selective" in reference to a material removal process denotes that the rate of material removal for a first material is greater than the rate of removal for at least another material of the structure to which the material removal process is being applied.

A layer of first-color hardmask material 106 is formed on the fin base material 104. It is specifically contemplated that the first-color hardmask material 106 may be formed from amorphous silicon, but any appropriate hardmask material having etch selectivity with the fin base material 104 and the other two tri-color hardmask materials may be used instead. In one embodiment the layer of first-color hardmask material 106 may have a thickness of about 20 nm.

A stack of layers is formed on top of the layer of first-color hardmask material 106. In particular, a first stack layer 108 is formed on the layer of first-color hardmask material 106 and may be formed from the same material as the fin base material 104 or any other appropriate material. In one embodiment the first stack layer 108 may have a thickness of about 5 nm. A second stack layer 110 is formed on the first stack layer 108. It is specifically contemplated that the second stack layer 110 may be formed from a dielectric material such as silicon boron carbonitride (SiBCN), as this material etches slowly in hydrofluoric acid, although other dielectric materials such as silicon carbonitride (SiCN) or silicon oxycarbide (SiOC) may be used instead. The second stack layer 110 may have a thickness of about 10 nm.

A thin seed layer of polymer material 112 is formed on the stack. It is specifically contemplated that the seed layer 112 may be formed from, e.g., cross-linkable polystyrene, though it should be understood that other materials may be selected instead. The seed layer 112 is selected for its ability to guide later self-assembly of block copolymers (BCPs). In particular, seed material should match one of the two chains of the block copolymer system. For example, if a polystyrene/poly(methyl methacrylate) (PMMA) block copolymer is used, the seed layer 112 may be cross-linkable polystyrene. If a polystyrene/polyvinylpyridine (PVP) block copolymer is used, then the seed layer 112 may be cross-linkable PVP. In one particular embodiment, the seed layer 112 may be formed to a thickness between about 5 nm and about 8 nm, though it should be understood that greater or lesser thicknesses are also contemplated.

A protection layer 114 is formed on the stack. The protection layer ensures that the surface chemistry of the seed layer 112 is preserved through subsequent process steps, in particular in the deposition of spacer layers, which could otherwise consume or damage the seed layer 112 if a plasma-enhanced deposition process is used. It is specifically contemplated that homopolymer polystyrene may be used for the protection layer 114, since it is an uncrosslinked polystyrene that is very similar to the underlying crosslinked polystyrene. However, other possible materials for the protection layer 114 include, without limitation, a silicon anti-reflective coating, a titanium anti-reflective coating, or a spin-on oxide material. The thickness of the protection layer 114 should be large enough to adequately protect the surface of the underlying seed layer 112.

A layer of oxide 116 is formed on the protection layer 114. The oxide layer 116 is used in later steps to help define sidewall image fins and may be formed from, e.g., silicon dioxide. Mandrels 118 are then formed on the oxide layer 116. A low-temperature adhesion promotion process is used to form the mandrels 118, for example hexamethyldisilazane (HMDS) at a temperature of around 80° C. If higher temperatures are used, thermal expansion in the protection layer 114 can cause misalignment of, or damage to, the mandrels 118. In one embodiment, the mandrels 118 have a pitch of about 80 nm and may be formed by a lithography process using, e.g., 193 nm light.

Figure 2:
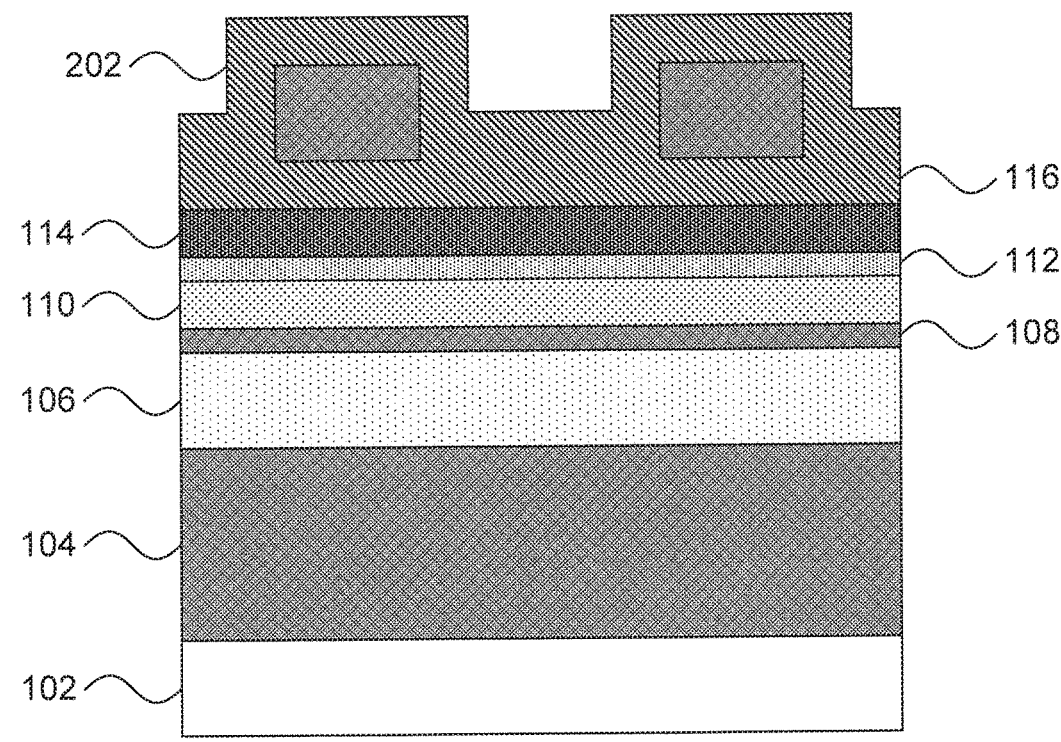
FIG. 2 is a cross-sectional diagram of a step in the formation of a tri-color hardmask in accordance with one embodiment of the present invention.

Referring now to FIG. 2, a cross-sectional diagram of a step in forming tri-color alternating hardmask is shown. An additional layer of oxide 202 is deposited over the mandrels 118. It is specifically contemplated that the additional layer of oxide 202 may be formed from the same material as the oxide layer 116 and may have an exemplary thickness of about 25 nm to about 30 nm.

Figure 3:
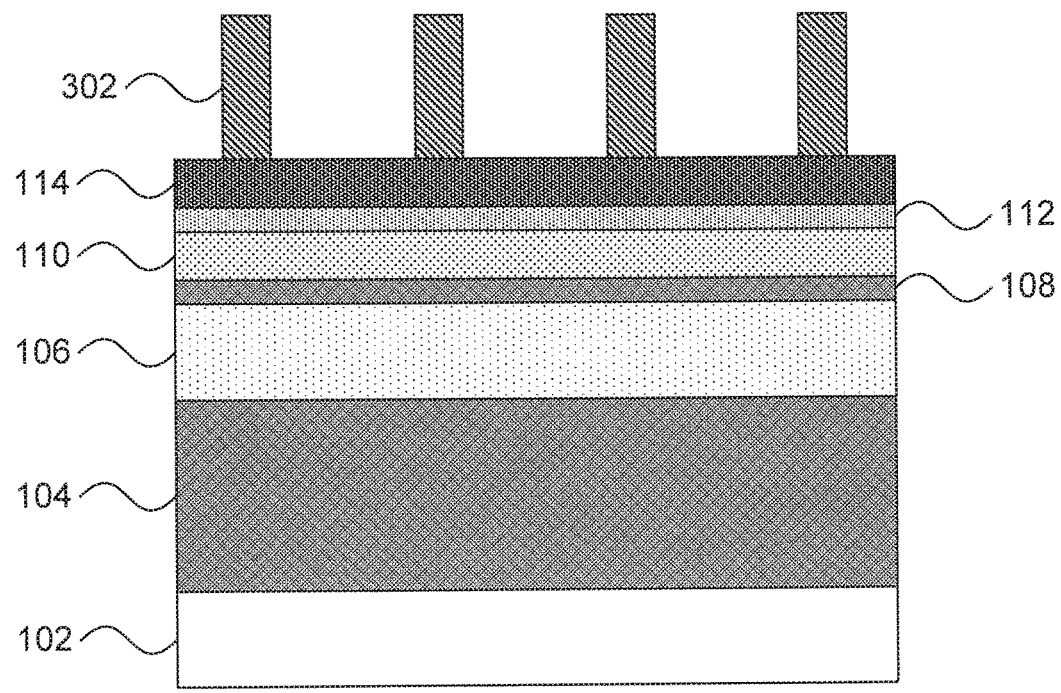
FIG. 3 is a cross-sectional diagram of a step in the formation of a tri-color hardmask in accordance with one embodiment of the present invention.

Referring now to FIG. 3, a cross-sectional diagram of a step in forming tri-color alternating hardmask is shown. The additional layer of oxide 202 is etched back to expose the mandrels 118 using, e.g., an anisotropic etch such as reactive ion etching (RIE). The mandrels 118 are etched away using any appropriate etch including, for example, a wet or dry isotropic chemical etch. The remaining oxide layer 202/116 is further etched anisotropically to remove the oxide material from horizontal surfaces, leaving behind oxide fins 302.

RIE is a form of plasma etching in which, during etching, the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point include ion beam etching, plasma etching or laser ablation.

Figure 4:
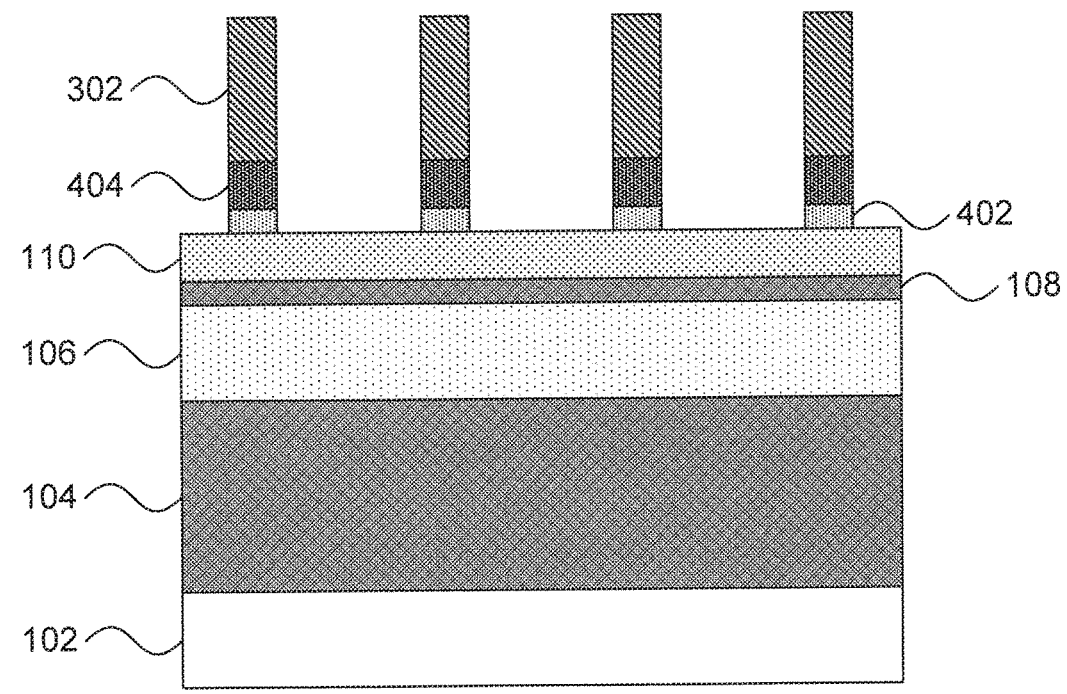
FIG. 4 is a cross-sectional diagram of a step in the formation of a tri-color hardmask in accordance with one embodiment of the present invention.

Referring now to FIG. 4, a cross-sectional diagram of a step in forming tri-color alternating hardmask is shown. The fins 302 are used as a mask to etch the seed layer 112 and the protection layer 114. A directional etch, such as RIE may be used. Remaining mask fin 302 after etch is then stripped by solvent that keeps the seed layer portions 402 intact. Portions of the protection layer 404 remain on fins of the seed layer 402.

Figure 5:
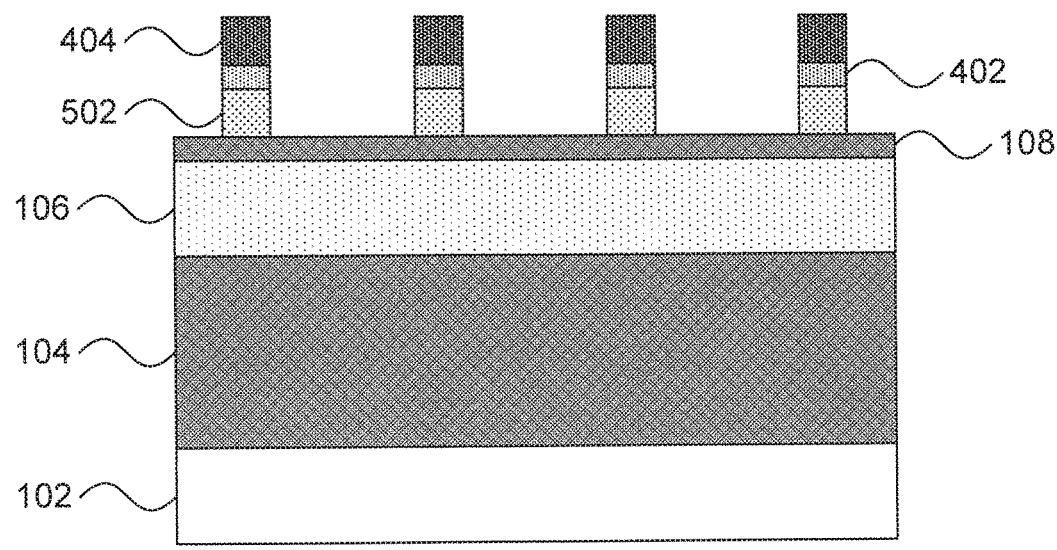
FIG. 5 is a cross-sectional diagram of a step in the formation of a tri-color hardmask in accordance with one embodiment of the present invention.

Referring now to FIG. 5, a cross-sectional diagram of a step in forming tri-color alternating hardmask is shown. The second stack layer 110 is anisotropically etched down using the above fins as a mask. If SiBCN is used for the second stack layer 110, a dry chemical etch may be used followed by, e.g., a buffered hydrofluoric acid etch to remove the oxide fins 302. The buffered hydrofluoric acid may cause the remaining portions of the protection layer 404 to collapse.

Figure 6:
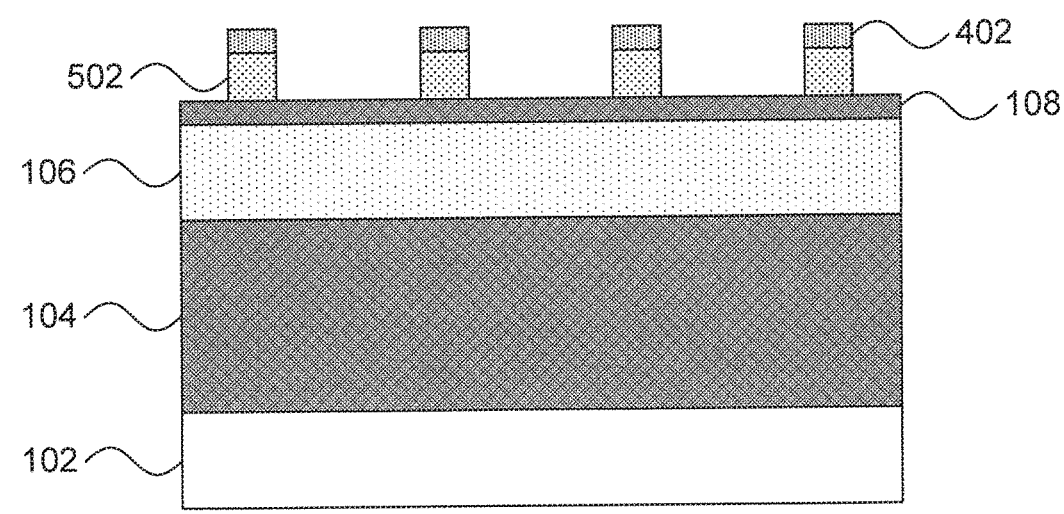
FIG. 6 is a cross-sectional diagram of a step in the formation of a tri-color hardmask in accordance with one embodiment of the present invention.

Referring now to FIG. 6, a cross-sectional diagram of a step in forming tri-color alternating hardmask is shown. The remaining portions of the protection layer 404 are removed using an appropriate solvent. An optional oxygen flash may be applied before this rinse, if needed.

Figure 7:
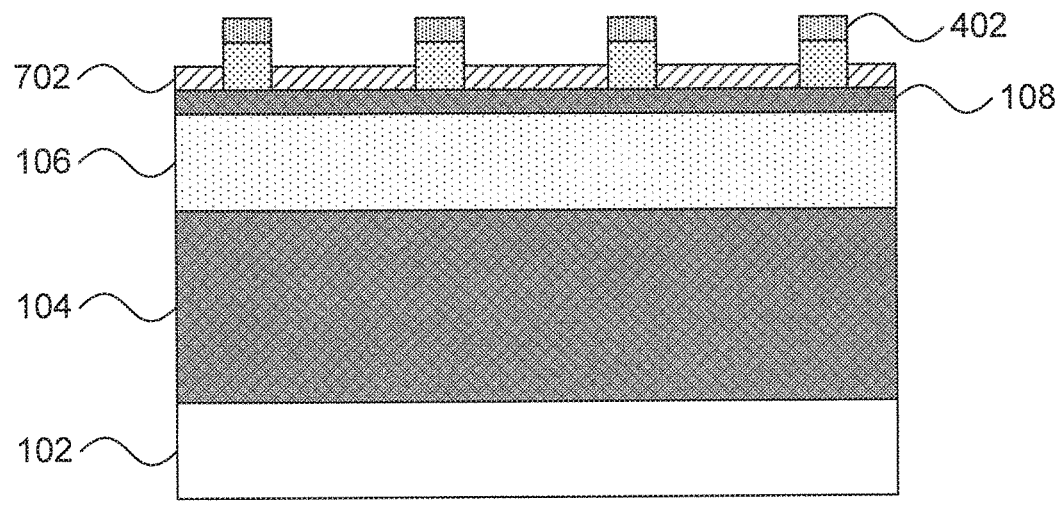
FIG. 7 is a cross-sectional diagram of a step in the formation of a tri-color hardmask in accordance with one embodiment of the present invention.

Referring now to FIG. 7, a cross-sectional diagram of a step in forming tri-color alternating hardmask is shown. A brush polymer layer 702 is applied over the first stack layer 108. The brush polymer 702 may be a linear polymer with a functional group at the chain end that bonds with the underlying substrate except material 204. Brush material 702 may be deposited using, e.g., spin coating. Limited by only one functional group per chain, a monolayer of brush is bonded to 108 and the sidewall of 502 while the excess brush can be rinsed away using solvents. The resulting thickness of the brush polymer layer 702 depends on the molecular size of the polymer, which is typically in the range of 2-10 nm. The pattern composed of 502, 402, and 702 is referred to as the guiding pattern for directed self-assembly. The brush polymer itself can be a random copolymer of the constituents of the block copolymer. For example, a polymer (styrene-random-MMA)-"end group" brush can be used for polystyrene-PMMA block copolymers.

Figure 8:
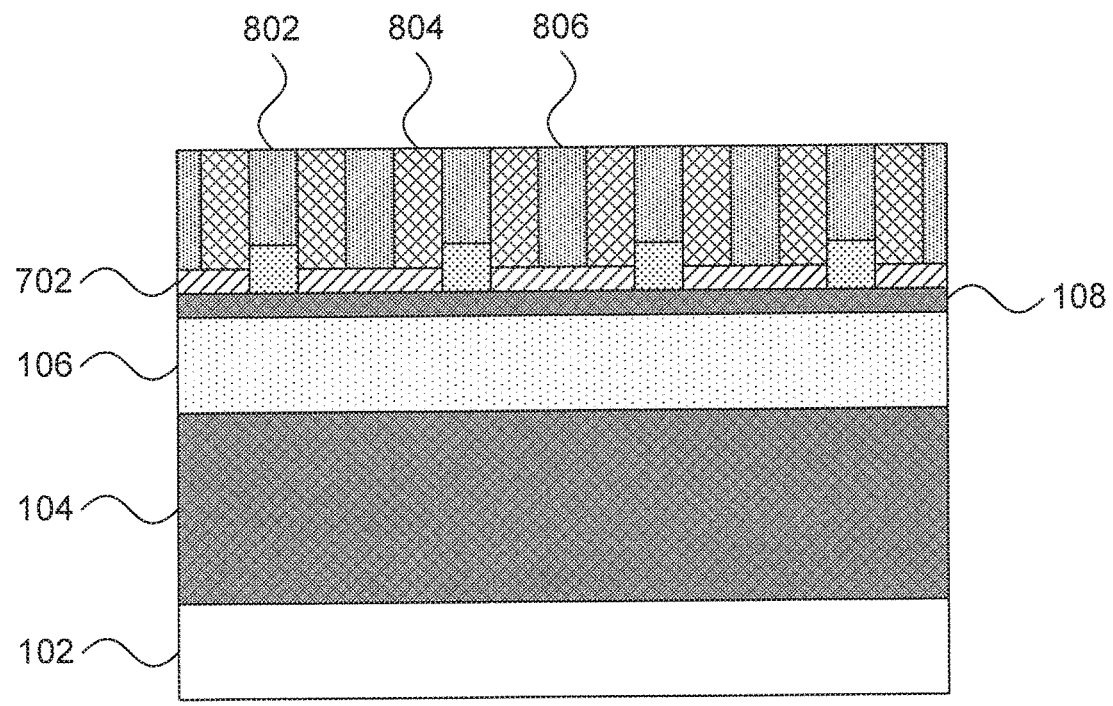
FIG. 8 is a cross-sectional diagram of a step in the formation of a tri-color hardmask in accordance with one embodiment of the present invention.

Referring now to FIG. 8, a cross-sectional diagram of a step in forming tri-color alternating hardmask is shown. A layer of block copolymers (BCP) is spin-coated over the guiding pattern and annealed between about 200 and about 280° C. for between about 5 and 100 minutes under nitrogen environment to promote the self-assembly process. This directed self-assembly (DSA) process of the BCPs will result in micro-domains 802, which will align to 402, 804, and 806, based on the locations of the remaining portions of seed layer 402. A BCP material used in this case is a linear polymer chain with two blocks of chemically distinct polymers covalently bonded together. In one specific example, the self-assembling BCP material may have one block that is polystyrene, e.g., forming fins 802 and 806, and one block that is poly(methyl methacrylate) (PMMA), e.g., forming fins 804.

The lengths of the polymer chains can be selected to produce micro-domains with pitch between about 10 nm and about 200 nm. In this case, it is specifically contemplated that the self-assembling material may have halves of equal length of about 5 nm each, forming a chain with a total length of about 10 nm. When the chains self-assemble, with like ends facing one another, the resulting fins of each material are about, e.g., 10 nm in width. The resulting alternating fin configuration has fin pitch much smaller than the original fin pitch on the guiding pattern. For example, if the mandrels 118 were formed with a fin pitch of about 80 nm, the fins of first DSA material and second DSA material may have a respective fin pitch of about 20 nm.

Figure 9:
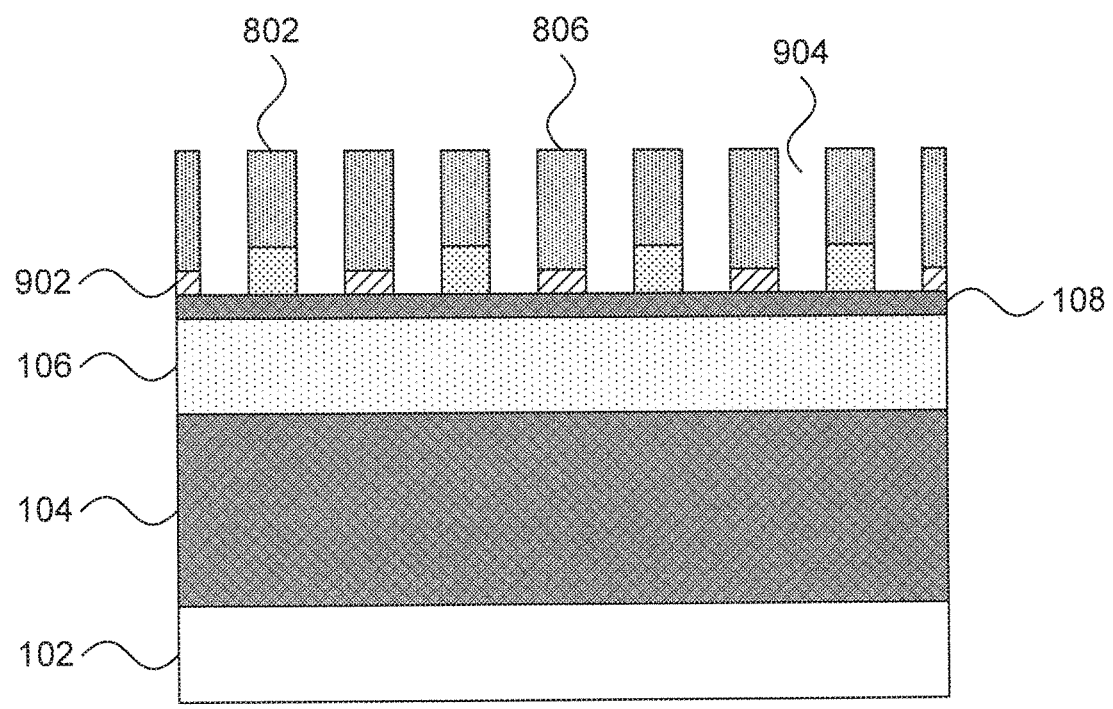
FIG. 9 is a cross-sectional diagram of a step in the formation of a tri-color hardmask in accordance with one embodiment of the present invention.

Referring now to FIG. 9, a cross-sectional diagram of a step in forming tri-color alternating hardmask is shown. The fins of second BCP block 804 are removed by selective etching, leaving gaps 904 between the fins of first DSA material 802/806. The etch selectively removes the second DSA material 804 with only partial consumption of the first DSA material 802/806 and also etches down into the brush polymer layer 702, leaving remaining brush polymer 902. Depending on the etch process chosen, selectivity between 804 and 802/806 is about or greater than 2.

Figure 10:
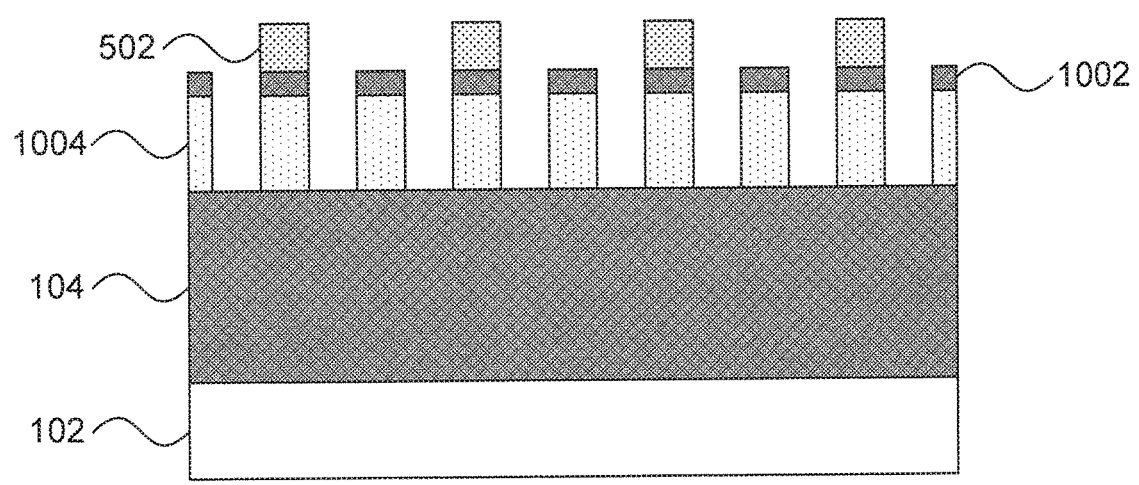
FIG. 10 is a cross-sectional diagram of a step in the formation of a tri-color hardmask in accordance with one embodiment of the present invention.

Referring now to FIG. 10, a cross-sectional diagram of a step in forming tri-color alternating hardmask is shown. Using the fins of first DSA material 802/806 as a mask, the layer of first-color hardmask material 106 is etched down. A first breakthrough etch, such as RIE, anisotropically etches the material of the first stack layer 108. Because 802/806 domains have a material-controlled, uniform dimension, any irregularities in the caps of second stack material 202 can be trimmed and rectified during the breakthrough etch. A second anisotropic etch, such as RIE, removes material from the layer of first-color hardmask material 106, forming fins 1004 with caps of the first stack material 1002. Caps of the second stack material 502 remain on alternating fins, providing fins of alternating heights.

Figure 11:
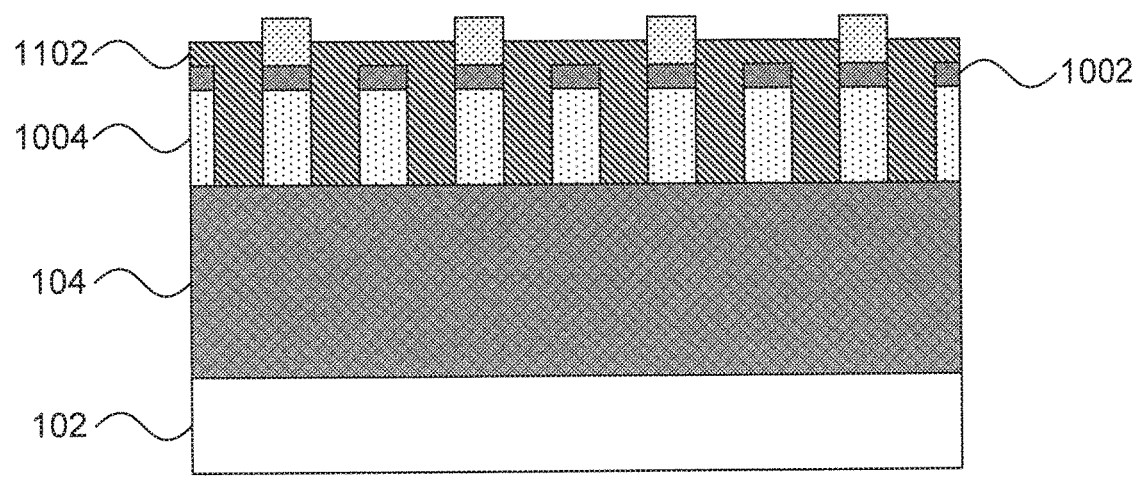
FIG. 11 is a cross-sectional diagram of a step in the formation of a tri-color hardmask in accordance with one embodiment of the present invention.

Referring now to FIG. 11, a cross-sectional diagram of a step in forming tri-color alternating hardmask is shown. An organic planarizing layer (OPL) 1102 is deposited onto the surface and recessed down below the height of the caps of second stack material 502 but above the height of the caps of first stack material 1002. In one embodiment, the OPL 1102 may be formed from, e.g., spin-on carbon that forms an amorphous-like carbon structure, but any appropriate planarization material may be used instead. The OPL 1102 is formed as a second-color hardmask material that has etch selectivity with the fin base material 104, the fins of first-color hardmask material 1004, and a third-color hardmask material.

Figure 12:
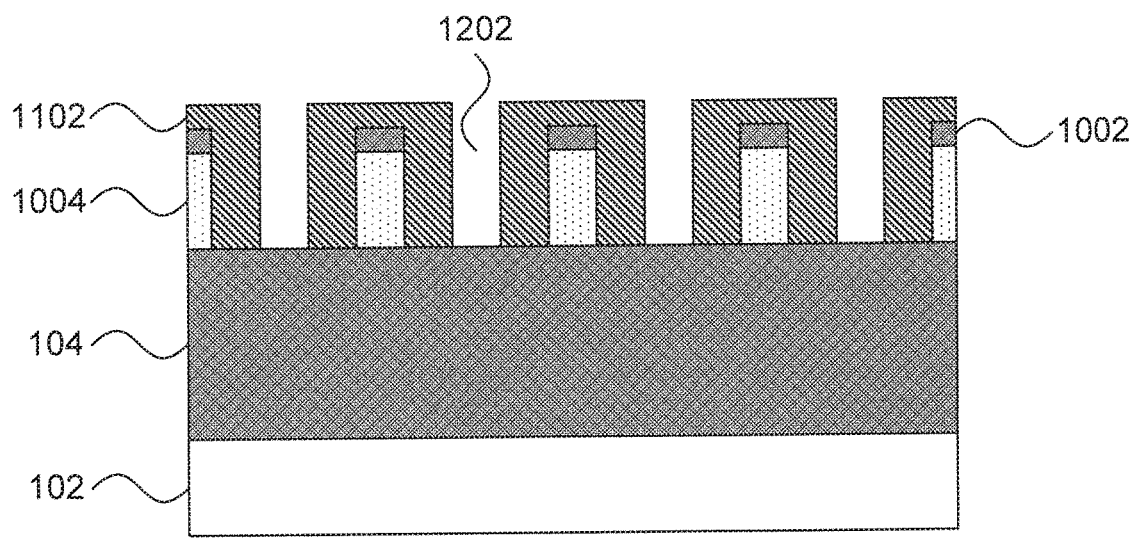
FIG. 12 is a cross-sectional diagram of a step in the formation of a tri-color hardmask in accordance with one embodiment of the present invention.

Referring now to FIG. 12, a cross-sectional diagram of a step in forming tri-color alternating hardmask is shown. The caps of second stack material 502 are removed selectively using, e.g., a buffered oxide etch, and the exposed caps of the second stack material 1002 are removed by a selective etch that leaves the OPL 1102 undamaged. Exposed fins 1004 are then removed by a selective etch, leaving behind those fins 1004 that are protected by the OPL 1102. Gaps 1202 remain between regions of the OPL 1102.

Figure 13:
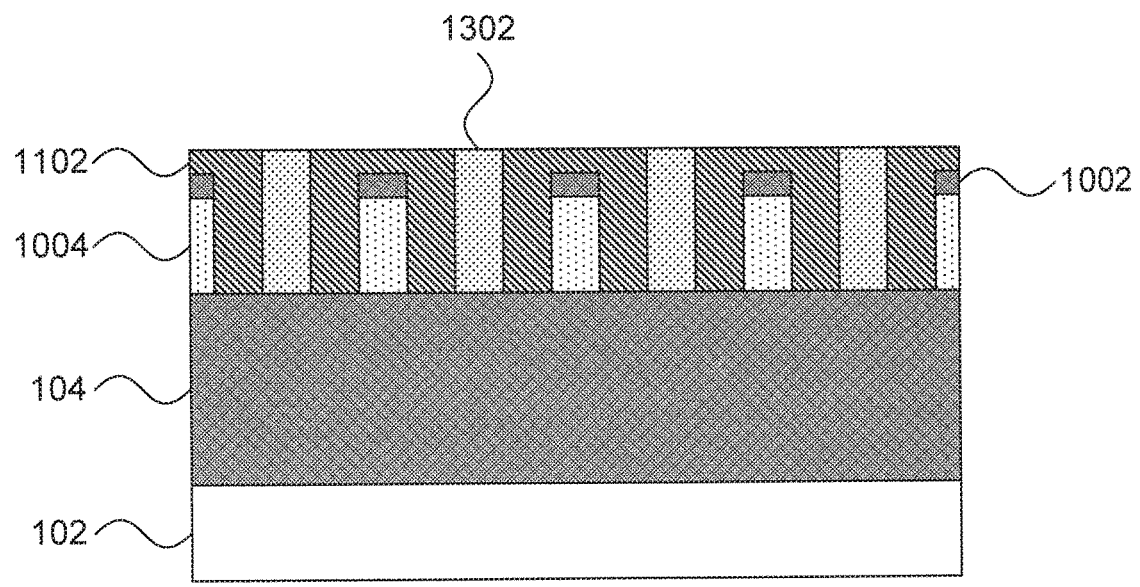
FIG. 13 is a cross-sectional diagram of a step in the formation of a tri-color hardmask in accordance with one embodiment of the present invention.

Referring now to FIG. 13, a cross-sectional diagram of a step in forming tri-color alternating hardmask is shown. The gaps 1202 are filled with a third-color hardmask material to form fins 1302. The third-color hardmask material may be, for example, silicon dioxide and may be deposited using, e.g., atomic layer deposition (ALD), spin-on deposition, or flowable deposition. Alternatively, the third-color hardmask material may be any appropriate material that has etch selectivity with the fins (the first-color hardmask material) 1004, the OPL (the second-color hardmask material) 1102, and the base fin material 104.

Figure 14:
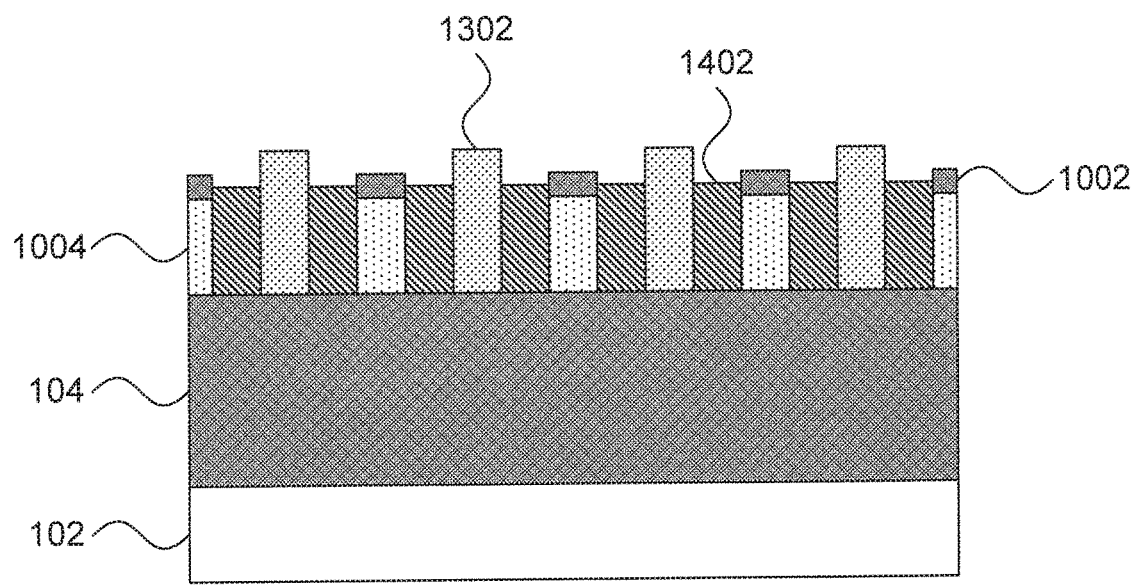
FIG. 14 is a cross-sectional diagram of a step in the formation of a tri-color hardmask in accordance with one embodiment of the present invention.

Referring now to FIG. 14, a cross-sectional diagram of a step in forming tri-color alternating hardmask is shown. The OPL 1102 is recessed below the height of the fin caps of first stack material 1002 by chemical mechanical planarization (CMP) or by RIE, separating the OPL 1102 into fins of second-color hardmask material 1402. The result is a series of fins which can be selectively etched with respect to their neighbors. In particular, the fins of first-color hardmask material 1004 and the fins of third-color hardmask material 1302 have a pitch to their closest neighbor of the same material that is about half of the pitch of the original mandrels 118 (e.g., about 40 nm). Thus, a mask can be reliably formed for the removal of one fin without affecting its direct neighbors.

Figure 15:
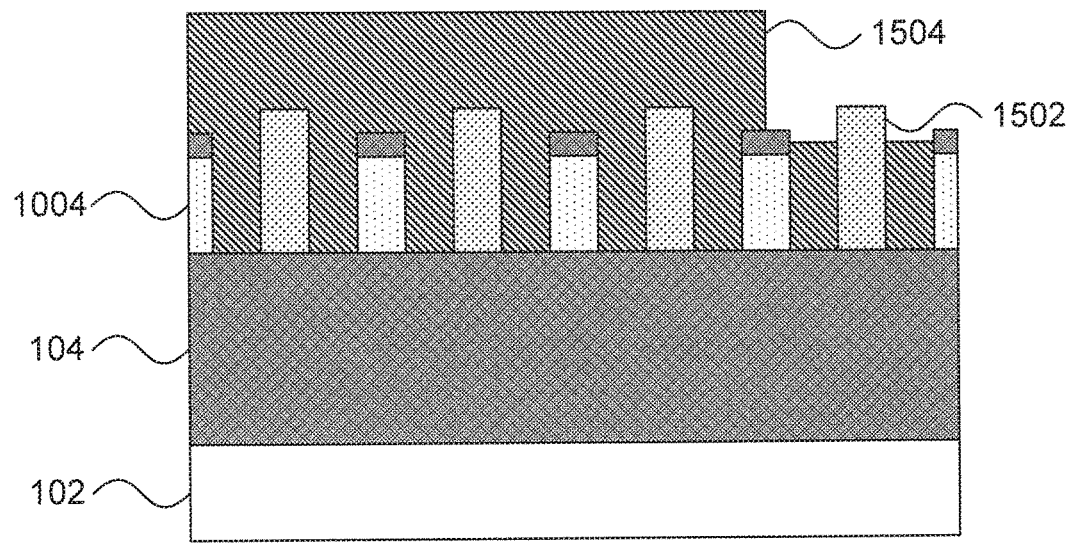
FIG. 15 is a cross-sectional diagram of a step in the selective etch of fins using a tri-color hardmask in accordance with one embodiment of the present invention.

Referring now to FIG. 15, a cross-sectional diagram of a step in selectively removing a fin is shown. A mask 1504 is formed, leaving exposed at least one fin 1502. It should be noted that the mask 1504 may expose neighboring fins as well, as long as those fins are not formed from the same material as the selected fin 1502. The mask 1504 may be formed by, e.g., chemical vapor deposition, physical vapor deposition, ALD, spin-on deposition, gas cluster ion beam (GCIB) deposition, or any other appropriate deposition process.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 16:
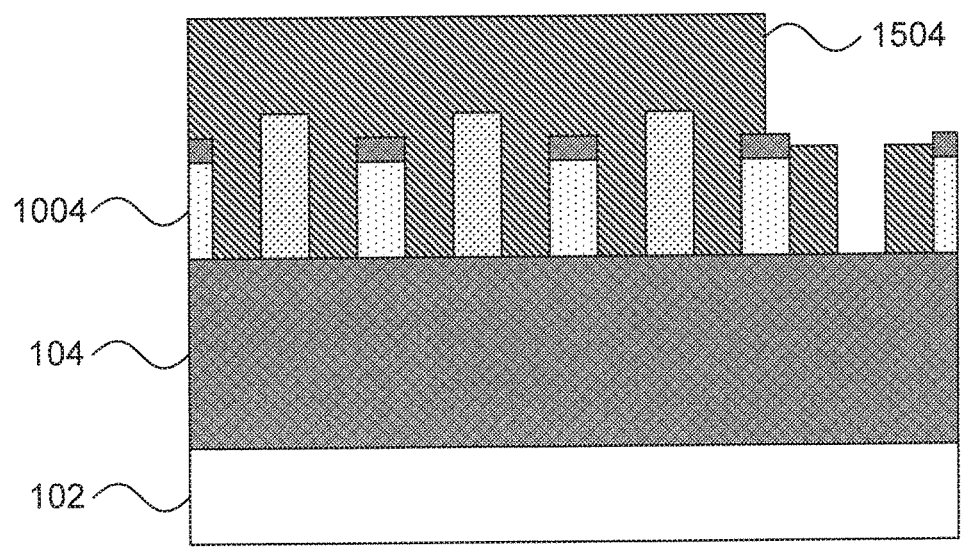
FIG. 16 is a cross-sectional diagram of a step in the selective etch of fins using a tri-color hardmask in accordance with one embodiment of the present invention.

Referring now to FIG. 16, a cross-sectional diagram of a step in selectively removing a fin is shown. The fin 1502 is etched away using any appropriate isotropic or anisotropic etch. Because the neighboring fin have etch selectivity with the selected fin 1502, they are not affected by the removal of the selected fin 1502.

Figure 17:
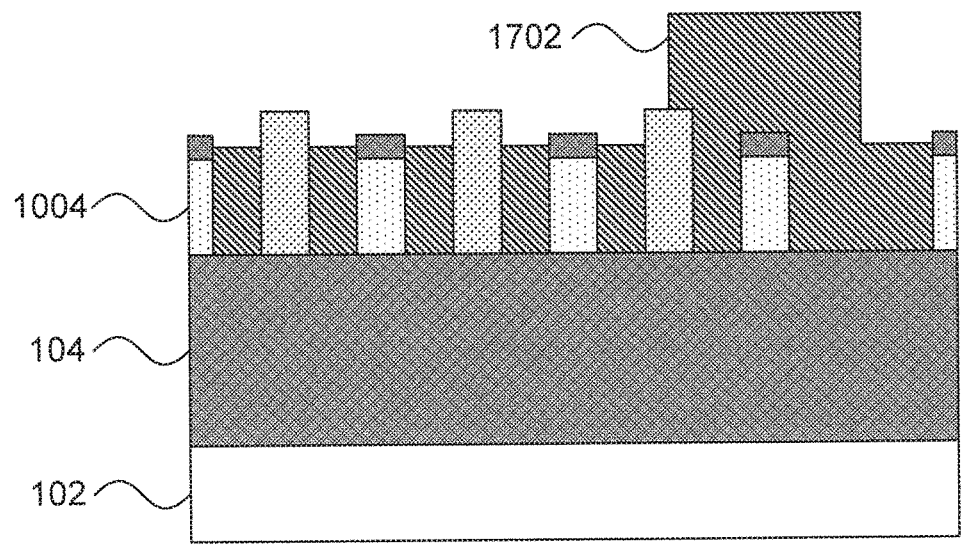
FIG. 17 is a cross-sectional diagram of a step in the selective etch of fins using a tri-color hardmask in accordance with one embodiment of the present invention.

Referring now to FIG. 17, a cross-sectional diagram of a step in selectively preserving a fin is shown. In this example, a mask 1702 is formed over a fin of a particular color to be preserved. The other fins of the first-color hardmask material 1004 remain uncovered.

Figure 18:
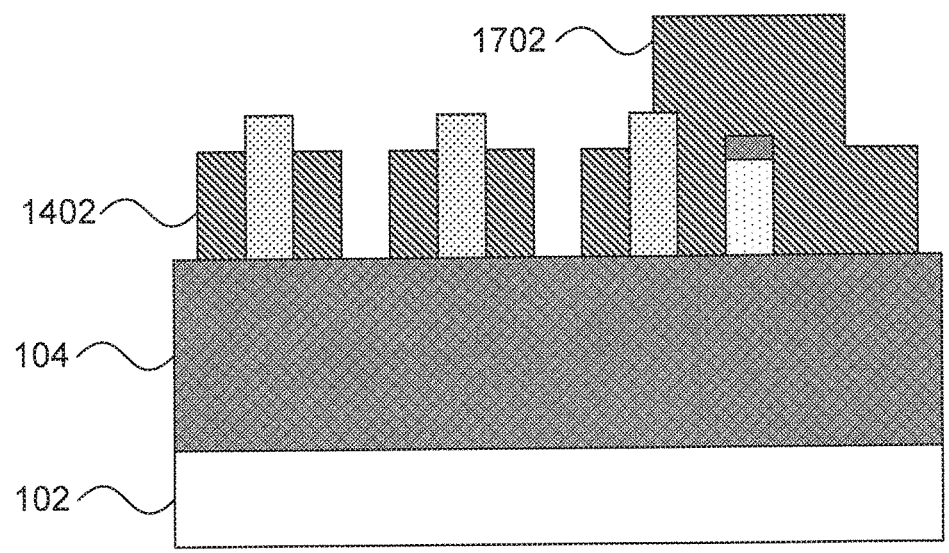
FIG. 18 is a cross-sectional diagram of a step in the selective etch of fins using a tri-color hardmask in accordance with one embodiment of the present invention.

Referring now to FIG. 18, a cross-sectional diagram of a step in selectively preserving a fin is shown. Those fins 1004 that are not covered by the mask 1702 are etched away using any appropriate etch. Because the pitch between the fins 1004 is large, there is little risk of the mask 1702 covering an unintended fin and preventing such a fin from being removed.

Figure 19:
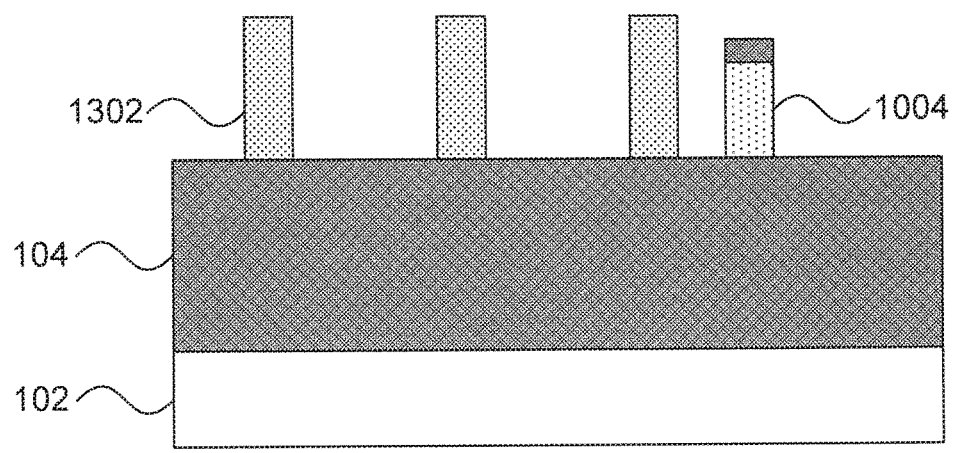
FIG. 19 is a cross-sectional diagram of a step in the selective etch of fins using a tri-color hardmask in accordance with one embodiment of the present invention.

Referring now to FIG. 19, a cross-sectional diagram of a step in forming semiconductor fins is shown. The remaining mask 1702 and the fins of the second-color hardmask material 1402 are removed by any appropriate isotropic or anisotropic etch process. The selected fins of first-color hardmask material 1004 and fins of third-color hardmask material 1302 remain on the fin base material 104.

Figure 20:
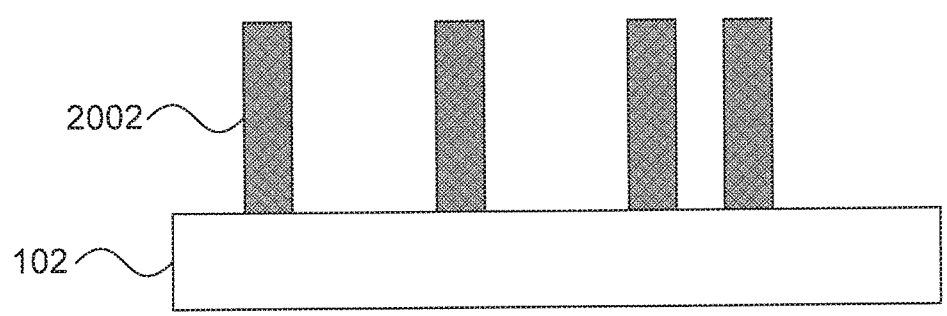
FIG. 20 is a cross-sectional diagram of a step in the selective etch of fins using a tri-color hardmask in accordance with one embodiment of the present invention.

Referring now to FIG. 20, a cross-sectional diagram of a step in forming semiconductor fins is shown. The remaining first-color fins 1004 and third-color fins 1302 are used as masks to etch the fin base material 104, producing a set of hardmask fins 2002. An appropriate directional etch such as RIE may be used, stopping on the underlying semiconductor substrate 102. The fins 2002 may be used directly in subsequent processing steps or may, alternatively, be used to form further fins in the semiconductor substrate 102 for, e.g., fin field effect transistors (FinFETs).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 21:
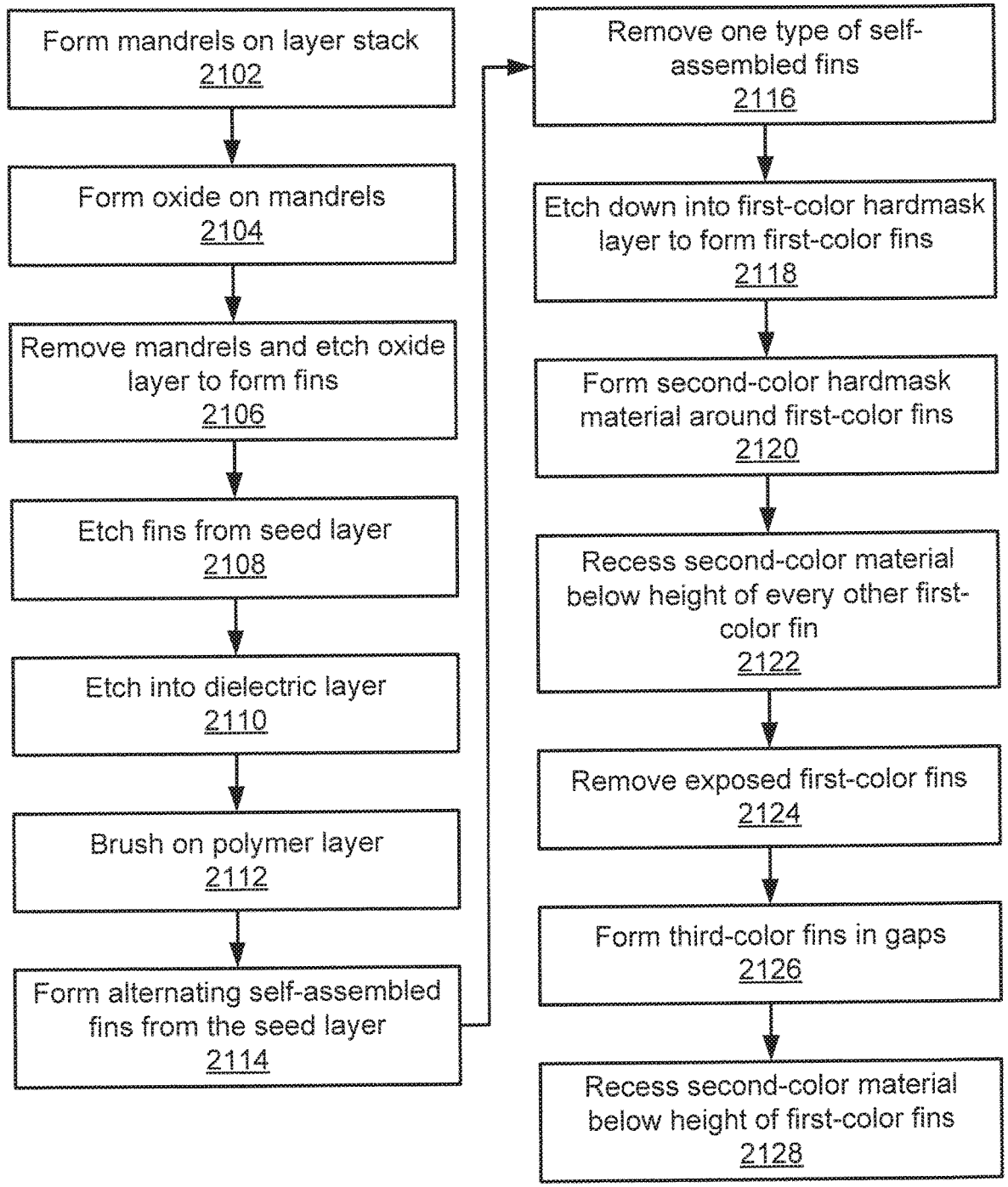
FIG. 21 is a block/flow diagram of a method of a forming tri-color hardmask in accordance with one embodiment of the present invention.

Referring now to FIG. 21, a method of forming three-color hardmask fins is shown. Block 2102 forms mandrels 118 on a stack of layers. The stack of layers is described in detail above with respect to FIG. 1. Block 2104 conformally forms an oxide layer 202 over the mandrels 118 using, e.g., CVD, ALD, PVD, or any other appropriate deposition process. Block 2106 etches back the oxide layer 202, removes the mandrels 118, and performs an isotropic etch of the remaining oxide layer 202 to form oxide fins 302.

Block 2108 uses the oxide fins as a mask to etch down into the protection layer 114 and the seed layer 112 with any appropriate anisotropic etch, creating seed layer fins 402. Block 2110 etches down into second stack layer 110 before block 2112 forms a monolayer of polymer brush material 702 on the first stack layer 108 between the seed layer fins 402.

Block 2114 forms alternating, self-assembled fins 802, 804, and 806 from the guiding pattern, using molecular chains that have one block that is attracted by the seed layer 402 and one block that sits on brush material 702. Block 2116 then removes one type of the fins (particularly fins 804) using a selective etch process. Block 2118 etches down into a first-color hardmask material 106 to form first-color fins 1004.

Block 2120 forms second-color hardmask material (e.g., OPL 1102) in the gaps between the first-color fins 1004. Block 2122 then recesses the second-color hardmask material down below the height of every other first-color fin, such that the second-color hardmask material has a height below the height of half of the first-color fins 1004 and above the height of the other half of the first color fins 1004.

Block 2124 removes the exposed first-color fins using any appropriate etch to form gaps 1202. Block 2126 forms third-color hardmask material in the gaps 1202. This material may be deposited by any appropriate deposition process and then polished down using, e.g., chemical mechanical planarization. CMP is performed using, e.g., a chemical or granular slurry and mechanical force to gradually remove upper layers of the device. The slurry may be formulated to be unable to dissolve, for example, the work function metal layer material, resulting in the CMP process's inability to proceed any farther than that layer.

Block 2128 recesses the second-color material below the height of all the first-color fins 1004. The result is three sets of fins: first-color fins 1004, second-color fins 1402, and third-color fins 1302. Each color of fins has etch selectivity with each of the others, such that positioning or size errors in a mask that covers or uncovers a particular fin are unlikely to affect neighboring fins of the same color.

Figure 22:
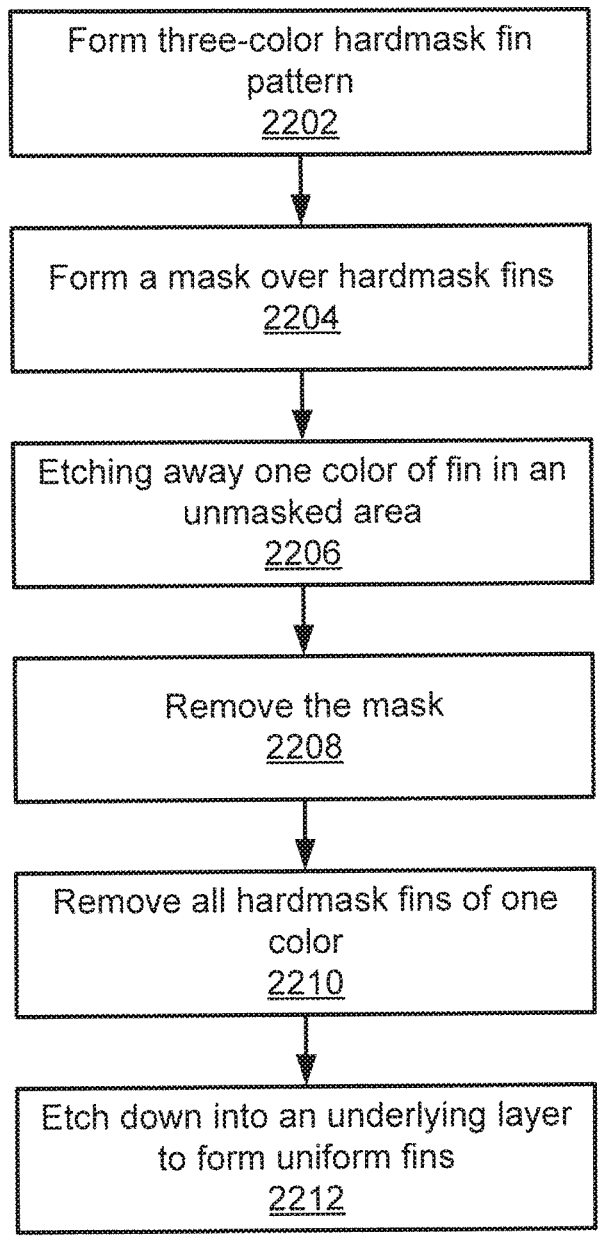
FIG. 22 is a block/flow diagram of a method of etching fins using a tri-color hardmask in accordance with one embodiment of the present invention.

Referring now to FIG. 22, a method of fin formation is shown. Block 2202 forms a three-color hardmask fin pattern, for example in the manner described above with respect to FIG. 21. The hardmask materials of the fins are formed in the sequence of Color ABCBABCBA . . . . Block 2204 forms a mask over the three-color hardmask fins, leaving one or more fins exposed. Block 2206 etches away one color of fin in the exposed area, leaving any other color of fin that may be exposed unharmed. Block 1808 removes the mask. One can repeat 2204 to 2208 multiple times to select different colors of fins to customize before moving onto block 2210, which removes all hardmask fins of one of the three colors. In the examples above, this refers to the second-color fins 1004. Block 2212 then etches down into an underlying layer (e.g., fin base material 104) to form fins of a uniform material, but with variable spacing.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming fins, comprising:
   masking a region on a three-color hardmask fin pattern, leaving a fin of a first color exposed;
   etching away the exposed fin of the first color with a selective etch that does not remove fins of a second color or a third color;
   etching away the mask and all fins of a second color; and
   etching fins into a fin base layer using the fins of the first color and the fins of the third color.

2. The method of claim 1, wherein forming the mask fins comprises:
   forming mandrels on a first oxide layer above the protection layer;
   forming a second oxide layer conformally over the mandrels;
   etching back oxide anisotropically and etch away the mandrels; and
   anisotropically etching the second oxide layer to form the mask fins.

3. The method of claim 1, further comprising forming the three-color hardmask fin pattern by:
   forming fins of the first color on the fin base layer using self-assembled fins as an etch mask;
   depositing a second-color material around the fins of the first color;
   etching away alternating fins of the first color, leaving gaps; and
   forming fins of a third color in the gaps.

4. The method of claim 3, wherein the self-assembled fins comprise fins of alternating polymer materials.

5. The method of claim 4, wherein forming the fins of the first color further comprises:
   etching away alternating self-assembled fins; and
   etching down into a layer of first-color material around the remaining self-assembled fins to form fins of a first color, the fins of the first color having fin caps of differing heights.

6. The method of claim 5, wherein the fin caps each comprise one or more dielectric layers, with different dielectric layers corresponding to different heights of the fin caps of the first color.

7. The method of claim 5, further comprising etching the second-color material to a height lower than a height of the tallest remaining fin caps and greater than a height of the shortest remaining fin caps.

8. The method of claim 5, wherein etching away alternating fins of the first color comprises etching away the fins of the first color having a greater-than-average height.

9. The method of claim 3, further comprising forming the self-assembled fins by applying a block copolymer material having two molecular chains of similar or equal length, wherein one of the two molecular chains is attracted to the seed layer.

10. The method of claim 9, wherein a first chain of the material comprises polystyrene and wherein a second chain of the material comprises poly(methyl methacrylate).

11. The method of claim 1, further comprising:
    forming mask fins on a protection layer over a seed layer;
    etching seed layer fins out of the seed layer;
    forming self-assembled fins by directed self-assembly on the seed layer fins; and
    forming the three-color hardmask fin pattern using the self-assembled fins as a mask.

12. The method of claim 1, further comprising:
    masking a region on the three-color hardmask fin pattern, leaving one or more fins of the third color exposed; and
    etching away all exposed fins of the third color with a selective etch that does not remove fins of the first color or the second color.

13. A method of forming a three-color hardmask fin pattern, comprising:
    forming seed layer fins;
    forming self-assembled fins by directed self-assembly on the seed layer fins;
    etching a layer of a first color using the self-assembled fins as a mask to form fins of a first color;
    depositing a second-color material around the fins of the first color;
    etching away fins of the first color, leaving at least one fin of the first color; and
    forming fins of a third color in gaps left by etching away fins of the first color.

14. The method of claim 13, wherein the self-assembled fins comprise alternating base materials.

15. The method of claim 14, further comprising etching away every other self-assembled fin, leaving remaining self-assembled fins having fin caps of differing heights before etching the layer of the first color.

16. The method of claim 15, wherein the fin caps each comprise one or more dielectric layers, with different dielectric layers corresponding to different heights of the fin caps.

17. The method of claim 15, wherein forming self-assembled fins comprises applying a material having two molecular chains of similar or equal length, wherein one of the two molecular chains is attracted to the seed layer.

18. The method of claim 17, wherein a first chain of the material comprises polystyrene and wherein a second chain of the material comprises poly(methyl methacrylate).

19. The method of claim 18, wherein the protection layer comprises uncrosslinked polystyrene and the seed layer comprises crosslinked polystyrene.

20. The method of claim 15, further comprising etching the second-color material to a height lower than a height of the tallest fin cap and greater than a height of the shortest fin cap.

* * * * *